United States Patent
Choi et al.

(10) Patent No.: US 8,330,135 B2
(45) Date of Patent: Dec. 11, 2012

(54) GERMANIUM BASED METAL-INSULATOR TRANSITION THIN FILM, METAL-INSULATOR TRANSITION DEVICE INCLUDING THE METAL-INSULATOR TRANSITION THIN FILM, AND METHOD OF FABRICATING THE METAL-INSULATOR TRANSITION DEVICE

(75) Inventors: Sung-Youl Choi, Ulsan (KR); Bong-Jun Kim, Daejeon (KR); Yong-Wook Lee, Daejeon (KR); Jae-Yeob Shim, Daejeon (KR); Hyun-Tak Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 376 days.

(21) Appl. No.: 12/671,890

(22) PCT Filed: Jun. 20, 2008

(86) PCT No.: PCT/KR2008/003516
§ 371 (c)(1),
(2), (4) Date: Feb. 2, 2010

(87) PCT Pub. No.: WO2009/017305
PCT Pub. Date: Feb. 5, 2009

(65) Prior Publication Data
US 2011/0233616 A1 Sep. 29, 2011

(30) Foreign Application Priority Data

Aug. 2, 2007 (KR) .......................... 10-2007-0077817
Nov. 30, 2007 (KR) .......................... 10-2007-0123639

(51) Int. Cl.
*H01L 47/00* (2006.01)
(52) U.S. Cl. ............. 257/2; 257/1; 257/5; 257/E49.002; 438/95; 438/478; 365/148; 365/186

(58) Field of Classification Search .................... 257/49, 257/528, 529, 536, 537, E49.001, E49.002; 438/95, 382, 384, 478; 365/148, 159, 163, 365/174, 186
See application file for complete search history.

(56) References Cited

U.S. PATENT DOCUMENTS
6,624,463 B2   9/2003   Kim et al.
(Continued)

FOREIGN PATENT DOCUMENTS
KR   2006-0006195 A   1/2006
(Continued)

OTHER PUBLICATIONS
J. B. Gunn, "Microwave Oscillations of Current in III-V Semiconductors", Solid State Communications vol. 1, pp. 88-91, 1963.

*Primary Examiner* — Eduardo A Rodela
(74) *Attorney, Agent, or Firm* — Rabin & Berdo, P.C.

(57) ABSTRACT

Provided are a germanium (Ge) based metal-insulator transition (MIT) thin film which is formed of a Ge single-element material instead of a compound material of two or more elements and by which material growth may be easily performed and a problem of a second phase characteristic in accordance with a structural defect and an included impurity may be solved, an MIT device including the MIT thin film, and a method of fabricating the MIT device. The MIT device includes a substrate; a germanium (Ge) based MIT thin film which is formed of a Ge single-element material on the substrate and in which a discontinuous MIT occurs at a predetermined transition voltage; and at least two thin film electrodes contacting the Ge based MIT thin film, wherein the discontinuous MIT occurs in the Ge based MIT thin film due to a voltage or a current which is applied through the thin film electrodes.

15 Claims, 4 Drawing Sheets

U.S. PATENT DOCUMENTS

2003/0054615 A1   3/2003  Kim et al.
2006/0011942 A1*  1/2006  Kim et al. .................... 257/192
2007/0069193 A1   3/2007  Yoon et al.
2007/0085122 A1   4/2007  Hyun et al.

FOREIGN PATENT DOCUMENTS

KR   2006-0101208 A   9/2006

* cited by examiner

GERMANIUM BASED METAL-INSULATOR TRANSITION THIN FILM, METAL-INSULATOR TRANSITION DEVICE INCLUDING THE METAL-INSULATOR TRANSITION THIN FILM, AND METHOD OF FABRICATING THE METAL-INSULATOR TRANSITION DEVICE

TECHNICAL FIELD

The present invention relates to a metal-insulator transition (MIT) device, and more particularly, to a germanium (Ge) based MIT thin film formed of a Ge single-element material instead of a compound material of two or more elements, an MIT device including the MIT thin film, and a method of fabricating the MIT device.

BACKGROUND ART

Recently, research has been actively conducted in regard to an insulator which is formed of an oxide such as $VO_2$ or a compound including holes such as GaAs and in which resistance variations occur due to an external voltage. In particular, experimental research has been performed in order to find a cause of transition in a discontinuous MIT material in which an abrupt transition occurs from an insulator to a metal.

The MIT material is formed on a substrate and then forms an electrode so that the MIT material may be used to form an MIT device having two or three terminals. Such an MIT device may be applied to various electronic devices. For example, a field effect transistor (FET) using an MIT material is disclosed in U.S. Pat. No. 6,624,463 B2 (Sep. 23, 2003).

In the MIT material or the MIT device including the MIT material, if a voltage applied to the MIT device is equal to or greater than a predetermined voltage (hereinafter referred to as a transition voltage), a current is discontinuously and abruptly increased or a resistance is discontinuously and abruptly decreased, and a transition occurs from an insulator state to a metal state.

In general, such an MIT material is formed of an oxide or a compound including holes. However, in the MIT material formed of two or more elements, an undesired second phase transition may occur after an MIT occurs.

DISCLOSURE OF INVENTION

Technical Problem

The present invention provides a germanium (Ge) based metal-insulator transition (MIT) thin film which is formed of a Ge single-element material instead of a compound material of two or more elements and by which material growth may be easily performed and a problem of a second phase characteristic in accordance with a structural defect and an included impurity may be solved, an MIT device including the MIT thin film, and a method of fabricating the MIT device.

Technical Solution

According to an aspect of the present invention, there is provided a germanium (Ge) based MIT thin film which is formed of a Ge single-element material on a substrate and in which a discontinuous metal-insulator transition (MIT) occurs at a predetermined transition voltage.

The substrate may include one of silicon (Si), Ge, GaAs, GaSb, InP, InAs, and AlAs and have one of an n-type, a p-type, and a non-doped type, and the Ge based MIT thin film may include a low concentration of holes and have a discontinuous MIT characteristic.

The substrate may include a buffer layer on an upper surface of the substrate, and the Ge based MIT thin film may be formed so as to have a thickness of 150~200 nm by using one of a sputtering method, a molecular beam epitaxy (MBE) method, an e-beam evaporation method, a thermal evaporation method, an atomic layer epitaxy (ALE) method, a pulsed laser deposition (PLD) method, a chemical vapor deposition (CVD) method, a sol-gel method, and an atomic layer deposition (ALD) method. Here, the buffer layer may include at least one of an $SiO_2$ layer, an SiN layer, an $Si_3N_4$ layer, and an $Al_2O_3$ layer.

The Ge based MIT thin film may be directly formed on the substrate. In this case, the substrate may be an undoped GaAs substrate having the same lattice structure as the Ge based MIT thin film, or an undoped Si substrate having a lattice constant that differs by approximately 7% from the lattice constant of the Ge based MIT thin film, and the Ge based MIT thin film may be formed so as to have a thickness of 150~200 nm, on the substrate by using an MBE method.

According to another aspect of the present invention, there is provided a metal-insulator transition (MIT) device including a substrate; a germanium (Ge) based MIT thin film which is formed of a Ge single-element material on the substrate and in which a discontinuous MIT occurs at a predetermined transition voltage; and at least two thin film electrodes contacting the Ge based MIT thin film, wherein the discontinuous MIT occurs in the Ge based MIT thin film due to a voltage or a current which is applied through the thin film electrodes.

The at least two thin film electrodes may include first and second thin film electrodes, and the MIT device may have a vertical structure in which the first thin film electrode is formed on the substrate, the Ge based MIT thin film is formed on the first thin film electrode, and the second thin film electrode is formed on the Ge based MIT thin film, or may have a horizontal structure in which the Ge based MIT thin film is formed on the substrate, and the first and second thin film electrodes are formed on both sides of the Ge based MIT thin film so as to face each other.

The substrate may include one of silicon (Si), Ge, GaAs, GaSb, InP, InAs, and AlAs and has one of an n-type, a p-type, and a non-doped type, and the Ge based MIT thin film may include a low concentration of holes and has a discontinuous MIT characteristic.

The Ge based MIT thin film may be directly formed on the substrate. In this case, the substrate may be an undoped GaAs substrate having the same lattice structure as the Ge based MIT thin film, or an undoped Si substrate having a lattice constant that differs by approximately 7% from the lattice constant of the Ge based MIT thin film, and the Ge based MIT thin film may be formed on the substrate by using an MBE method.

The thin film electrodes may include at least one of aluminum (Al), copper (Cu), nickel (Ni), tungsten (W), molybdenum (Mo), chrome (Cr), zinc (Zn), magnesium (Mg), iron (Fe), cobalt (Co), tin (Sn), lead (Pb), gold (Au), silver (Ag), platinum (Pt), titanium (Ti), tantalum (Ta), TaN, TaW, WN, TiN, TiW, poly-Si, TrO, RuO, InO:Sn (InSnO), or ZnO. A resistor may be connected to one of the thin film electrodes.

The MIT device may be applicable to at least one of an MIT battery, an MIT light emission device, an MIT sensor, an MIT two-terminal switching device, an MIT three-terminal switching device (transistor), an MIT memory, an MIT oscillator, and an MIT radio frequency (RF) device.

According to another aspect of the present invention, there is provided a method of fabricating a metal-insulator transition (MIT) device, the method including forming a first thin film electrode on a substrate; forming a germanium (Ge) based MIT thin film which is formed of a Ge single-element material on the substrate and in which a discontinuous MIT occurs at a predetermined transition voltage, on the first thin film electrode; and forming a second thin film electrode on the Ge based MIT thin film.

According to another aspect of the present invention, there is provided a method of fabricating a metal-insulator transition (MIT) device, including forming a germanium (Ge) based MIT thin film which is formed of a Ge single-element material on the substrate and in which a discontinuous MIT occurs at a predetermined transition voltage, on a substrate; and forming first and second thin film electrodes on both sides and on portions of an upper surface of the Ge based MIT thin film, on the substrate, so as to have a predetermine distance between the first and second thin film electrodes.

The substrate may be an undoped GaAs substrate or an undoped silicon (Si) substrate, the Ge based MIT thin film may be formed on the substrate by using an MBE method, if the substrate is the undoped GaAs substrate, the undoped GaAs substrate may have the same lattice structure as the Ge based MIT thin film, and if the substrate is the undoped Si substrate, the undoped Si substrate may have a lattice constant that differs by approximately 7% from the lattice constant of the Ge based MIT thin film.

The Ge based MIT thin film may be formed by growing the Ge based MIT thin film at a temperature of 400~500° C. at a pressure of $10^{-10}$~$10^{-9}$ torr for ten minutes.

The substrate may include one of Si, Ge, GaAs, GaSb, InP, InAs, and AlAs and has one of an n-type, a p-type, and a non-doped type, the method may further include forming a buffer layer on the substrate, and the Ge based MIT thin film may be formed by using one of a sputtering method, a molecular beam epitaxy (MBE) method, an e-beam evaporation method, a thermal evaporation method, an atomic layer epitaxy (ALE) method, a pulsed laser deposition (PLD) method, a chemical vapor deposition (CVD) method, a sol-gel method, and an atomic layer deposition (ALD) method.

The Ge based MIT thin film may be formed by using the sputtering method and by growing the Ge based MIT thin film at a temperature of 400~500° C. at a pressure of $10^{-6}$~$10^{-5}$ torr for five minutes.

Advantageous Effects

According to the present invention, a Ge based MIT thin film may be formed of a high-purity Ge single-element material and thus may be easily grown at a low cost in comparison to an MIT thin film formed of a compound material of two or more elements. Also, a Ge based MIT device including the Ge based MIT thin film may be fabricated.

Furthermore, a Ge based MIT thin film, according to the present invention, may have a high transition temperature and thus problems in terms of structural defects and electric characteristic variances may be solved and a problem of a second phase characteristic may also be solved.

Accordingly, a Ge based MIT device including a Ge based MIT thin film, according to the present invention, may be applied to various devices using an MIT phenomenon, such as an electronic device/apparatus or an electric system, an MIT solar battery, and an MIT light emission device to which an MIT device including an MIT thin film formed of a compound material of two or more elements.

DESCRIPTION OF DRAWINGS

The above and other features and advantages of the present invention will become more apparent by describing in detail exemplary embodiments thereof with reference to the attached drawings in which.

BEST MODE

Figure 1:
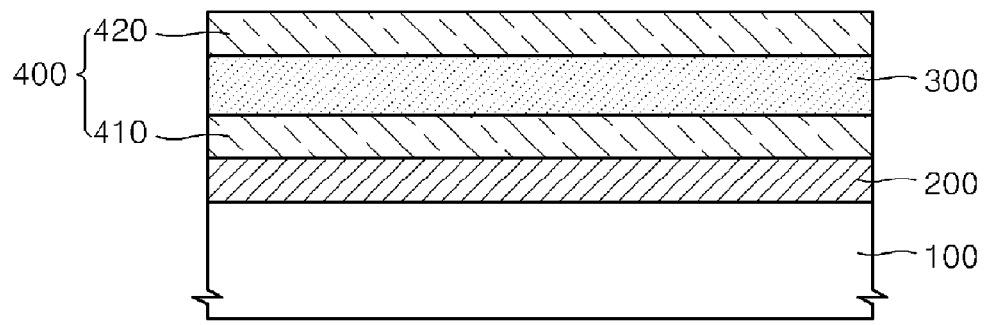
FIG. 1 is a cross-sectional view of a germanium (Ge) based metal-insulator transition (MIT) device, according to an embodiment of the present invention.

The present invention will now be described more fully with reference to the accompanying drawings, in which exemplary embodiments of the invention are shown. It will be understood that when an element is referred to as being 'on' another element, it can be directly on the other element, or an intervening element may also be present. In the drawings, the thicknesses or sizes of elements are exaggerated for convenience and clarity of explanation and parts unrelated to the description are omitted. Like reference numerals in the drawings denote like elements. Meanwhile, terms used to describe the present invention are for descriptive purposes only and are not intended to limit the scope of the invention.

FIG. 1 is a cross-sectional view of a germanium (Ge) based metal-insulator transition (MIT) device, according to an embodiment of the present invention.

Referring to FIG. 1, the Ge based MIT device according to the current embodiment of the present invention has a vertical structure and includes a substrate 100, a buffer layer 200 formed on the substrate 100, an MIT thin film 300, and an thin film electrode 400 including a first thin film electrode 410 formed on the buffer layer 200, and a second thin film electrode 420 formed on the MIT thin film 300.

The buffer layer 200 buffers lattice mismatch between the substrate 100 and the first thin film electrode 410. If the lattice mismatch between the substrate 100 and the first thin film electrode 410 is very small, the first thin film electrode 410 may be directly formed on the substrate 100 without forming the buffer layer 200. The buffer layer 200 may include at least one of an $SiO_2$ layer, an SiN layer, an $Si_3N_4$ layer, and an $Al_2O_3$ layer.

The substrate 100 may include one of silicon (Si), Ge, GaAs, GaSb, InP, InAs, and AlAs and have one of an n-type, a p-type, and a non-doped type. Also, the substrate 100 may include at least one of $SiO_2$, $Al_2O_3$, plastic, glass, $V_2O_5$, $PrBa_2Cu_3O_7$, $YBa_2Cu_3O_7$, MgO, $SrTiO_3$, $SrTiO_3$ doped with Nb, and silicon-on-insulator (SOI).

Electric characteristics of the MIT thin film 300 abruptly vary in accordance with a voltage applied through two electrodes. That is, the MIT thin film 300 has characteristics of an insulator if the voltage is less than a transition voltage and has characteristics of a metal due to a discontinuous MIT if the voltage is equal to or greater than the transition voltage.

An MIT thin film may include at least one of a p-type inorganic semiconductor, a p-type inorganic insulator, a p-type organic semiconductor, and a p-type organic insulator including a low concentration of holes. Each of MIT thin film materials such as the p-type inorganic semiconductor, the p-type inorganic insulator, the p-type organic semiconductor, and the p-type organic insulator may include at least one of oxygen (O), carbon (C), Si, Ge, a semiconductor compound (groups III-V and II-IV), a transition metal element, a rare-earth element, and a lanthanum (La) based element. For example, the MIT thin film may be formed of compounds such as GaAS, GaSb, InP, InAs, and GeSbTe (GST), or semiconductor materials such as Si and Ge. Meanwhile, the MIT thin film may include an n-type semiconductor or an n-type insulator which have very large resistances. Here, the concentration of the included holes is approximately $3 \times 10^{16}$ $cm^{-3}$.

In more detail, the MIT thin film may include at least one of an oxide layer material containing at least one of $Al_2O_3$, $VO_2$, $V_2O_3$, $ZrO_2$, ZnO, $HfO_2$, CuO, $Ta_2O_5$, $La_2O_3$, $Fe_2O_3$, NiO, and MgO, an oxide layer material containing at least one of $Al_xTi_yO$, $Zn_xTi_yO$, $Zr_xTi_yO$, $Ta_xTi_yO$, $V_xTi_yO$, $La_xTi_yO$, $Ba_xTi_yO$, and $Sr_xTi_yO$, and a semiconductor material containing at least one of GaAS, GaSb, InP, InAs, GST, Si, and Ge.

However, the MIT thin film 300 according to the current embodiment of the present invention is formed of only a Ge single-element material instead of a compound material of two or more elements. That is, the MIT thin film 300 is a Ge based MIT thin film.

Such an MIT thin film 300 may be formed by using various methods. If the MIT thin film 300 is formed on the buffer layer 200 or the first thin film electrode 410 as in the current embodiment of the present invention, the MIT thin film 300 may be formed by selecting appropriate materials for the buffer layer 200 or the first thin film electrode 410, and using various deposition methods.

For example, the MIT thin film 300 may be formed by using at least one of a sputtering method, a molecular beam epitaxy (MBE) method, an e-beam evaporation method, a thermal evaporation method, an atomic layer epitaxy (ALE) method, a pulsed laser deposition (PLD) method, a chemical vapor deposition (CVD) method, a sol-gel method, and an atomic layer deposition (ALD) method.

Meanwhile, the thin film electrode 400 may include at least one of aluminium (Al), copper (Cu), nickel (Ni), tungsten (W), molybdenum (Mo), chrome (Cr), zinc (Zn), magnesium (Mg), iron (Fe), cobalt (Co), tin (Sn), lead (Pb), gold (Au), silver (Ag), platinum (Pt), titanium (Ti), tantalum (Ta), TaN, TaW, WN, TiN, TiW, poly-Si, and an oxide electrode. Here, the oxide electrode may be IrO, RuO, InO:Sn (InSnO), or ZnO.

According to the current embodiment of the present invention, by forming the MIT thin film 300 of the Ge based MIT device using only a Ge single-element material, material growth may be easily performed and an undesired problem of a second phase characteristic in accordance with an included impurity and a structural defect caused by combining two or more elements may be solved, in comparison to an MIT film formed of a compound of two or more elements.

Thus, due to the above-described advantages, the Ge based MIT device including the MIT thin film 300 formed of the Ge single-element material may be applied to various devices using an MIT phenomenon, such as an MIT battery, an MIT light emission device, an MIT sensor, an MIT two-terminal switching device, an MIT three-terminal switching device (transistor), an MIT memory, an MIT oscillator, and an MIT radio frequency (RF) device.

Figure 2:
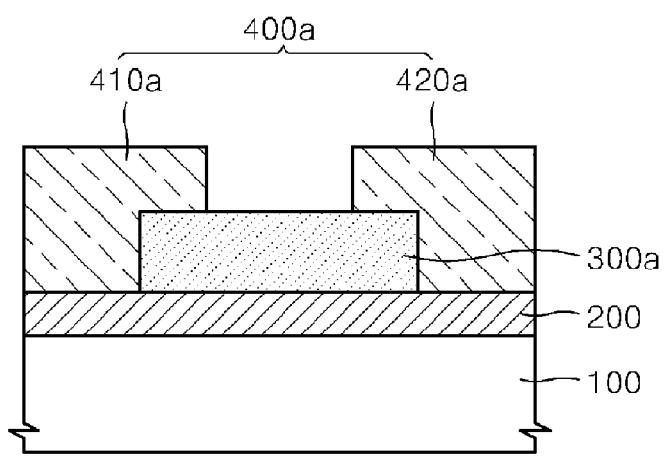
FIG. 2 is a cross-sectional view of a Ge based MIT device, according to another embodiment of the present invention.

FIG. 2 is a cross-sectional view of a Ge based MIT device, according to another embodiment of the present invention.

Referring to FIG. 2, the Ge based MIT device according to the current embodiment of the present invention has a horizontal structure and includes a substrate 100, a buffer layer 200 formed on the substrate 100, an MIT thin film 300a formed on a portion of an upper surface of the buffer layer 200, and a thin film electrode 400a including first and second thin film electrodes 410a and 420b which face each other and are formed on both sides and portions of an upper surface of the MIT thin film 300a. That is, the first and second thin film electrodes 410a and 420b are separated from each other by exposing the MIT thin film 300a therebetween.

The buffer layer 200 reduces lattice mismatch between the substrate 100 and the MIT thin film 300a. If the lattice mismatch between the substrate 100 and the MIT thin film 300a is very small, the MIT thin film 300a may be directly formed on the substrate 100 without forming the buffer layer 200. It is obvious that the above-mentioned materials may be used to form the substrate 100, the buffer layer 200, and the thin film electrode 400a.

Meanwhile, the MIT thin film 300a according to the current embodiment of the present invention is also a Ge based MIT thin film formed of only a Ge single-element material. Also, as described above with reference to FIG. 1, such an MIT thin film 300 may be formed by selecting an appropriate material for the buffer layer 200, and using at least one of various deposition methods such as a sputtering method, a MBE method, an e-beam evaporation method, a thermal evaporation method, an ALE method, a PLD method, a CVD method, a sol-gel method, and an ALD method.

Such a Ge based MIT device having a horizontal structure may be fabricated to a small size of a μm unit at a very low cost.

Figure 3A:
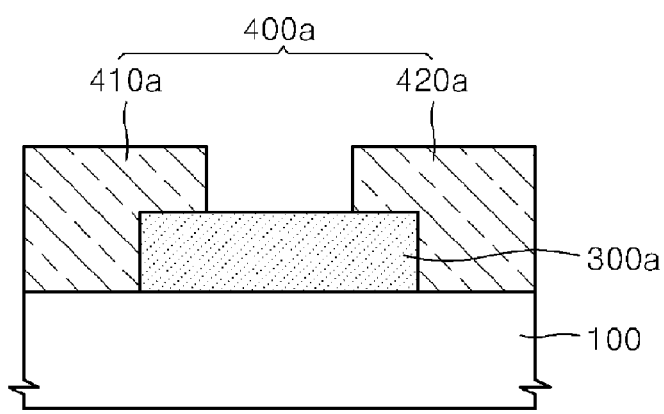
FIGS. 3A and 3B are a cross-sectional view and a plan view, respectively, of a Ge based MIT device, according to another embodiment of the present invention.
Figure 3B:
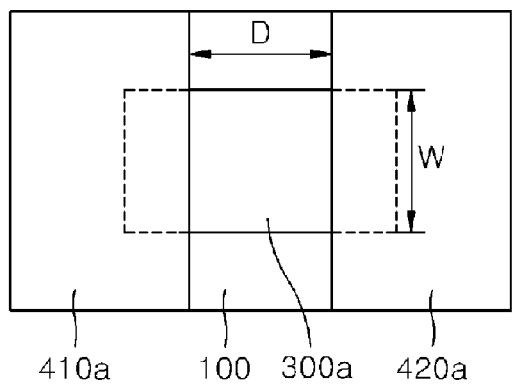

FIGS. 3A and 3B are a cross-sectional view and a plan view, respectively, of a Ge based MIT device, according to another embodiment of the present invention.

In FIGS. 3A and 3B, the Ge based MIT device according to the current embodiment of the present invention includes a substrate 100, an MIT thin film 300a, and an thin film electrode 400a including first and second thin film electrodes 410a and 420b.

Referring to FIG. 3A, the Ge based MIT device has a similar structure to the Ge based MIT device according to the previous embodiment of FIG. 2, and does not include a buffer layer. Accordingly, in FIG. 3, the MIT thin film 300a has to be formed with care. That is, according to the current embodiment of the present invention, a Ge based MIT thin film is directly grown on the substrate 100 by using MBE equipment, so as to form the MIT thin film 300a.

When a high-purity thin film is grown by using the MBE equipment, one of the most important factors is the substrate 100 that is required to deposit a growing material. This is because the quality of the growing material depends on lattice mismatch between the growing material and the substrate 100.

In the current embodiment of the present invention, an undoped GaAs substrate having an orientation in a direction [100] in terms of crystallography or an undoped Si substrate having an orientation in the direction [100] in terms of crystallography is used. On the undoped GaAs substrate, the amount of defects in relation to the MIT thin film are reduced because the lattice mismatch does not occur between the MIT thin film 300a and the undoped GaAs substrate. Thus, the high-purity thin film may be grown.

A lattice constant of the undoped Si substrate differs by approximately 7% from the lattice constant of the MIT thin film 300a. The undoped Si substrate is used in order to vary a growing direction of the MIT thin film 300a. That is, the undoped Si substrate is used in order to vary a growth axis (crystal axis) of the growing material by using the lattice mismatch between the undoped Si substrate and the growing material. Also, if the undoped Si substrate is used, manufacturing costs may be greatly reduced in comparison to the undoped GaAs substrate and a large area thin film may be easily formed.

Meanwhile, it is obvious that the buffer layer such as an $SiO_2$ thin film may be formed between the substrate 100 and the MIT thin film 300a without directly forming the MIT thin film 300a on the substrate in order to remove the influence of the substrate 100 and to enable low cost large-scale production by growing the MIT thin film 300a by using various deposition methods such as a sputtering method, without using expensive MBE equipment.

As described above with reference to FIG. 1, a discontinuous MIT occurs in the Ge based MIT device if an applied voltage is equal to or greater than a transition voltage. The transition voltage may vary in accordance with a structure of the Ge based MIT device. For example, referring to FIG. 3B, the transition voltage may vary by varying a distance D between the first and second thin film electrodes 410a and 420b or a width W of the MIT thin film 300a.

The Ge based MIT device according to the previous embodiment of FIG. 2 has a plan view similar to the plan view of FIG. 3B. However, the buffer layer 200 is formed on the substrate 100 in the Ge based MIT device according to the previous embodiment of FIG. 2 and thus the buffer layer 200, instead of the substrate 100, may be exposed between the first and second thin film electrodes 410a and 420b. In a Ge based MIT device having a horizontal structure, the transition voltage may also vary by varying the distance D between the first and second thin film electrodes 410a and 420b or the width W of the MIT thin film 300a.

Figure 4A:
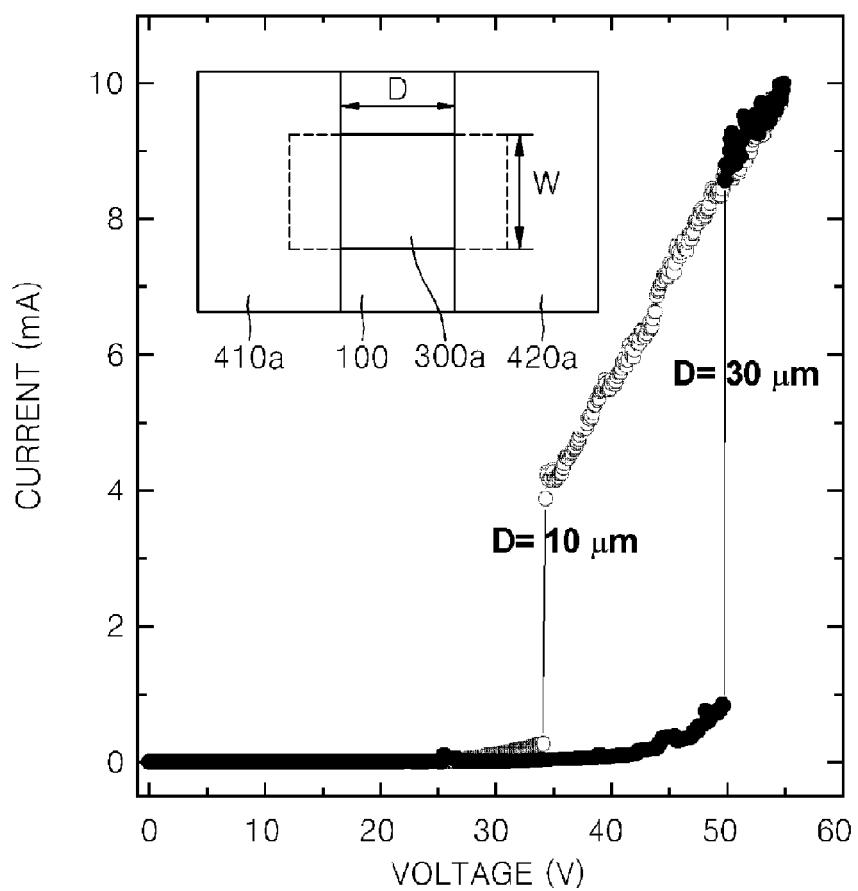
FIG. 4A is a graph of a current and a voltage in a voltage mode of a Ge based MIT device using an undoped silicon (Si) substrate illustrated in FIG. 3A, according to an embodiment of the present invention.

FIG. 4A is a graph of a current and a voltage in a voltage mode of a Ge based MIT device using an undoped Si substrate illustrated in FIG. 3A, according to an embodiment of the present invention.

Referring to FIG. 4A, it is clear that a transition voltage of the Ge based MIT device varies in accordance with the distance D between the first and second thin film electrodes 410a and 420b illustrated in FIG. 3B. The shorter the distance D between the first and second thin film electrodes 410a and 420b is, the lower the transition voltage is.

Figure 4B:
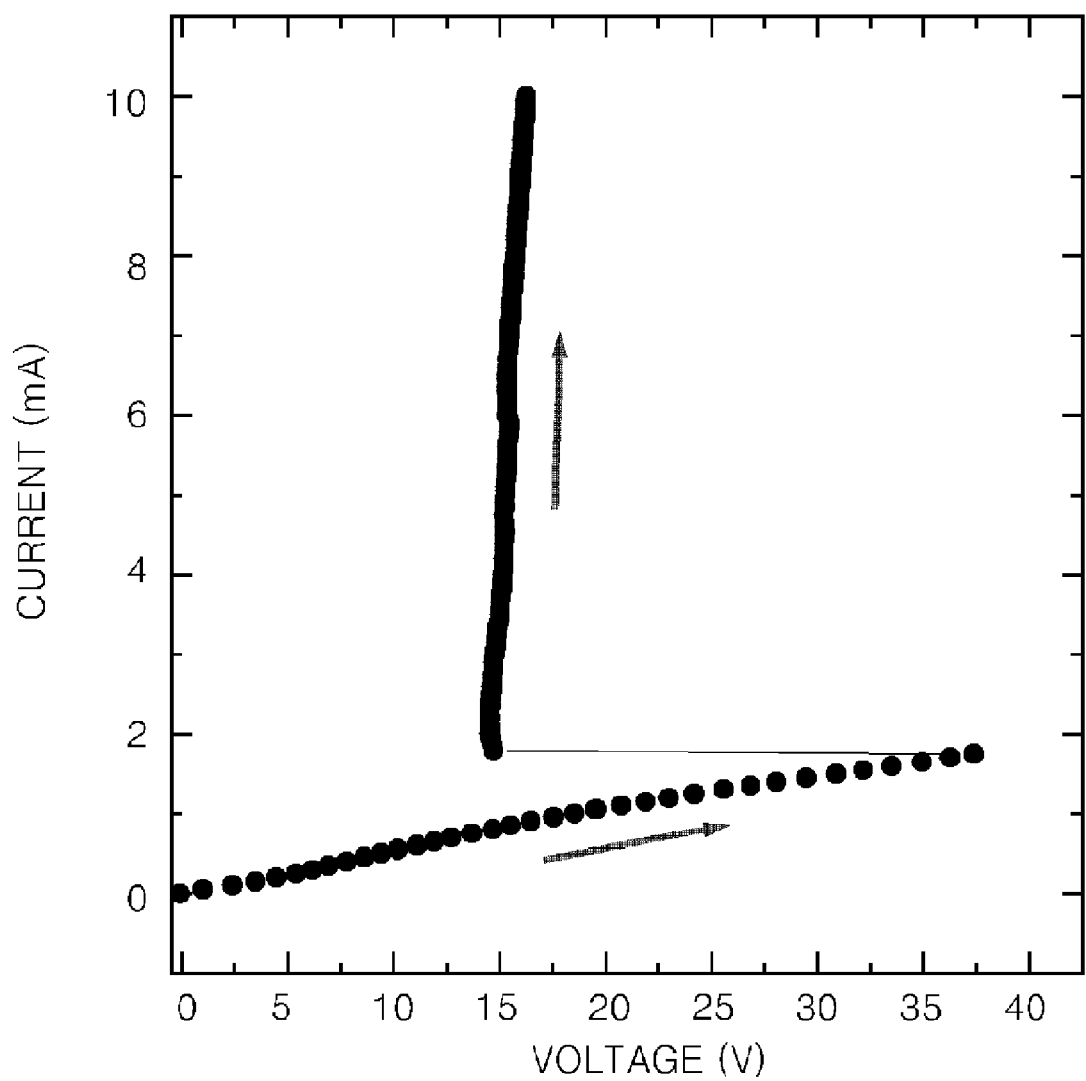
FIG. 4B is a graph of a current and a voltage in a current mode of a Ge based MIT device using an undoped Si substrate illustrated in FIG. 3A, according to an embodiment of the present invention.

FIG. 4B is a graph of a current and a voltage in a current mode of a Ge based MIT device using an undoped Si substrate illustrated in FIG. 3A, according to an embodiment of the present invention.

Referring to FIG. 4B, the current and the voltage are measured by increasing the current flowing through the Ge based MIT device, in the current mode, that is, in a state when a maximum voltage applied to the Ge based MIT device is restricted to a predetermined voltage. As illustrated in FIG. 4B, after an MIT occurs, the voltage instantly drops and the current abruptly increases at the same time.

As shown in FIGS. 4A and 4B, a Ge based MIT thin film formed of only a Ge single-element material and an MIT thin film formed of two or more elements have almost the same MIT characteristics.

Meanwhile, a transition voltage of the Ge based MIT thin film formed on an undoped GaAs substrate is relatively higher than the transition voltage of the Ge based MIT thin film formed on the undoped Si substrate. This is because the Ge based MIT thin film formed on the undoped GaAs substrate does not have lattice mismatch and thus has a large resistance value. The transition voltage of the Ge based MIT thin film may be controlled by connecting an external variable resistance to one of first and second thin film electrodes, controlling a distance between the first and second thin film electrodes, selecting an appropriate material for a buffer layer, or varying a growing condition of the Ge based MIT thin film.

Figure 5A:
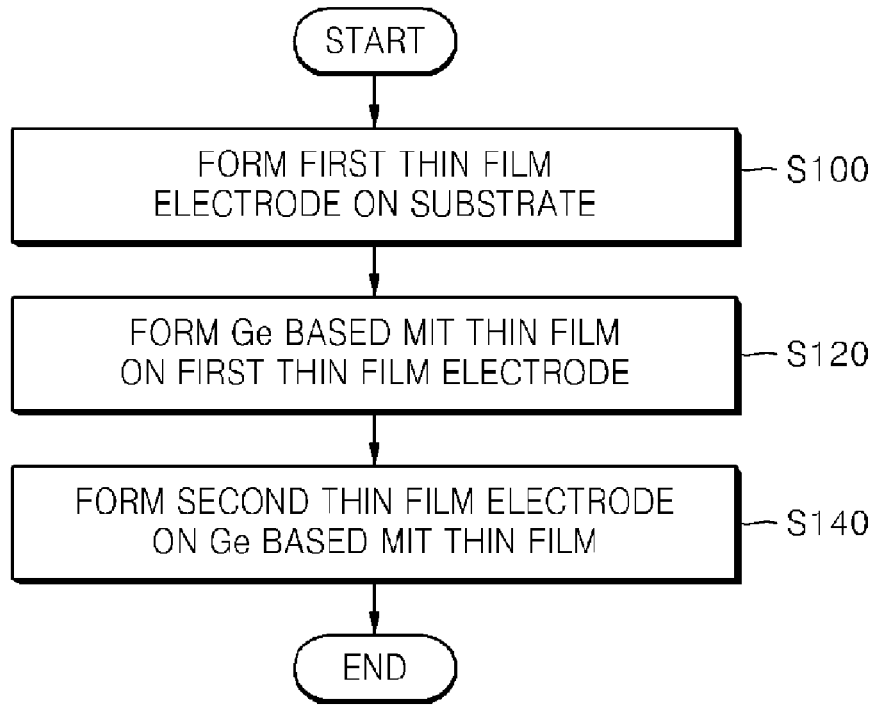
FIG. 5A is a flowchart of a method of fabricating a Ge based MIT device, according to an embodiment of the present invention.

FIG. 5A is a flowchart of a method of fabricating a Ge based MIT device, according to an embodiment of the present invention.

Referring to FIG. 5A, initially, a first thin film electrode is formed on a substrate in operation S100. As described above with reference to FIG. 1, the first thin film electrode may include at least one of Al, Cu, Ni, W, Mo, Cr, Zn, Mg, Fe, Co, Sn, Pb, Au, Ag, Pt, Ti, Ta, TaN, TaW, WN, TiN, TiW, poly-Si, and an oxide electrode. Here, the oxide electrode may be IrO, RuO, InSnO, or ZnO. Meanwhile, before the first thin film electrode is formed, a appropriate buffer layer may be formed on the substrate in order to reduce lattice mismatch between the substrate and the first thin film electrode.

Then, a Ge based MIT thin film is formed on the first thin film electrode in operation S120. The Ge based MIT thin film may be formed by using at least one of a sputtering method, an MBE method, an e-beam evaporation method, a thermal evaporation method, an ALE method, a PLD method, a CVD method, a sol-gel method, and an ALD method.

In particular, if the sputtering method is used, the Ge based MIT thin film having a thickness of approximately 150~200 nm may be obtained by growing the Ge based MIT thin film at a temperature of 400~500° C. at a pressure of $10^{-6}$~$10^{-5}$ torr for five minutes. Meanwhile, after the Ge based MIT thin film is grown, thermal treatment may be performed on the Ge based MIT thin film at the same temperature in order to increase stability of the Ge based MIT thin film. The sputtering method has an advantage in that Ge based MIT thin films of various thicknesses may be grown in various times by varying a plasma generating condition.

The Ge based MIT thin film grown by using the sputtering method has MIT characteristics in that a discontinuous MIT occurs at a predetermined transition voltage by generating a low concentration of required holes in the Ge based MIT thin film by controlling a proper temperature when the Ge based MIT thin film is grown.

A second thin film electrode is formed on the Ge based MIT thin film generated as described above in operation S140. It is obvious that the second thin film electrode may be formed of the same material as the first thin film electrode.

Figure 5B:
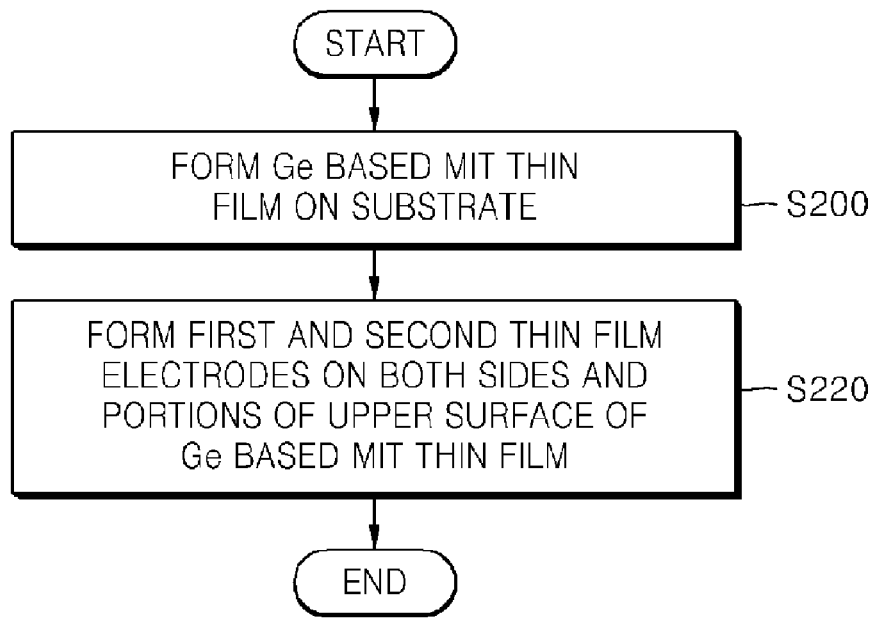
FIG. 5B is a flowchart of a method of fabricating a Ge based MIT device, according to another embodiment of the present invention.

FIG. 5B is a flowchart of a method of fabricating a Ge based MIT device, according to another embodiment of the present invention.

Referring to FIG. 5B, initially, a Ge based MIT thin film is formed on a substrate in operation S200. When the Ge based MIT thin film is directly formed on the substrate, a material of the substrate is important. Thus, an undoped GaAs substrate or an undoped Si substrate having an orientation in a direction

[100] in terms of crystallography may be used as the substrate, as described above with reference to FIG. 3A.

The Ge based MIT thin film formed on the undoped GaAs substrate or the undoped Si substrate may be formed by using an MBE method. The Ge based MIT thin film having a thickness of approximately 150~200 nm may be obtained by growing the Ge based MIT thin film at a temperature of 400~500° C., particularly approximately 450° C., at a pressure of $10^{-10}$~$10^{-9}$ torr for ten minutes. Meanwhile, after the Ge based MIT thin film is grown, thermal treatment may be performed on the Ge based MIT thin film at the same temperature as in which it was grown in order to increase stability of the Ge based MIT thin film.

The Ge based MIT thin film directly formed on the substrate has MIT characteristics in that a discontinuous MIT occurs at a predetermined transition voltage by generating a low concentration of required holes in the Ge based MIT thin film by controlling arrangement of atoms when the Ge based MIT thin film is grown.

Meanwhile, it is obvious that a proper buffer layer including, for example, at least one of an $SiO_2$ layer, an SiN layer, an $Si_3N_4$ layer, and an $Al_2O_3$ layer may be formed on the substrate instead of directly forming the Ge based MIT thin film on the substrate so that the Ge based MIT thin film may be formed on the buffer layer by using various methods including the MBE method, which are described above with reference to FIGS. 1, 2, and 5A.

After the Ge based MIT thin film is formed, first and second thin film electrodes are formed by depositing a conductive material on both sides and on portions of an upper surface of the Ge based MIT thin film, in operation S220. The first and second thin film electrodes may be formed of at least one of the materials described above with reference to FIGS. 1 and 5A. The first and second thin film electrodes are formed so as to be separated from each other by exposing the Ge based MIT thin film therebetween. As described above with reference to FIGS. 3B, 4A, and 4B, the transition voltage of the Ge based MIT device may be controlled by controlling a distance between the first and second thin film electrodes.

As described above, according to the present invention, a Ge based MIT thin film may be formed of a high-purity Ge single-element material and thus may be easily grown at a low cost in comparison to an MIT thin film formed of a compound material of two or more elements. Also, a Ge based MIT device including the Ge based MIT thin film may be fabricated.

Furthermore, a Ge based MIT thin film, according to the present invention, may have a high transition temperature and thus problems in terms of structural defects and electric characteristic variances may be solved and a problem of a second phase characteristic may also be solved.

Accordingly, a Ge based MIT device including a Ge based MIT thin film, according to the present invention, may be applied to various devices using an MIT phenomenon, such as an electronic device/apparatus or an electric system, an MIT solar battery, and an MIT light emission device to which an MIT device including an MIT thin film formed of a compound material of two or more elements.

While the present invention has been particularly shown and described with reference to exemplary embodiments thereof, it will be understood by those of ordinary skill in the art that various changes in form and details may be made therein without departing from the spirit and scope of the invention as defined by the appended claims. The exemplary embodiments should be considered in a descriptive sense only and not for purposes of limitation. Therefore, the scope of the invention is defined not by the detailed description of the invention but by the appended claims, and all differences within the scope will be construed as being included in the present invention.

INDUSTRIAL APPLICABILITY

The present invention relates to a metal-insulator transition (MIT) device, and more particularly, to a germanium (Ge) based MIT thin film formed of a Ge single-element material instead of a compound material of two or more elements, an MIT device including the MIT thin film, and a method of fabricating the MIT device. According to the present invention, a Ge based MIT thin film may be formed of a high-purity Ge single-element material and thus may be easily grown at a low cost in comparison to an MIT thin film formed of a compound material of two or more elements. Also, a Ge based MIT device including the Ge based MIT thin film may be fabricated.

The invention claimed is:

1. A germanium (Ge) based MIT thin film, comprising:
   a Ge single-element material formed on a substrate, wherein
     a discontinuous metal-insulator transition (MIT) in the Ge based MIT thin film occurs at a predetermined transition voltage;
     the substrate includes one of silicon (Si), Ge, GaAs, GaSb, InP, InAs, and AlAs, is one of an n-type, a p-type, and a non-doped type, and has a buffer layer on an upper surface thereof;
     the Ge based MIT thin film includes a low concentration of holes, has a discontinuous MIT characteristic, and is formed so as to have a thickness of 150~200 nm by using one of a sputtering method, a molecular beam epitaxy (MBE) method, an e-beam evaporation method, a thermal evaporation method, an atomic layer epitaxy (ALE) method, a pulsed laser deposition (PLD) method, a chemical vapor deposition (CVD) method, a sol-gel method, and an atomic layer deposition (ALD) method.

2. The Ge based MIT thin film of claim 1, wherein the buffer layer comprises at least one of an $SiO_2$ layer, an SiN layer, an $Si_3N_4$ layer, and an $Al_2O_3$ layer.

3. The Ge based MIT thin film of claim 1, wherein the substrate is an undoped GaAs substrate having the same lattice structure as the Ge based MIT thin film, or an undoped Si substrate having a lattice constant that differs by approximately 7% from the lattice constant of the Ge based MIT thin film, and
   wherein the Ge based MIT thin film is formed so as to have a thickness of 150~200 nm, on the substrate by using an MBE method.

4. A metal-insulator transition (MIT) device comprising:
   a substrate;
   a germanium (Ge) based MIT thin film which is formed of a Ge single-element material on the substrate and in which a discontinuous MIT occurs at a predetermined transition voltage; and
   at least two thin film electrodes contacting the Ge based MIT thin film, wherein
     the discontinuous MIT occurs in the Ge based MIT thin film due to a voltage or a current which is applied through the thin film electrodes,
     the substrate is an undoped GaAs substrate having the same lattice structure as the Ge based MIT thin film, or an undoped Si substrate having a lattice constant that differs by approximately 7% from the lattice constant of the Ge based MIT thin film, and the Ge based MIT thin film is formed on the substrate by using an MBE method.

5. The MIT device of claim 4, wherein the at least two thin film electrodes comprises first and second thin film electrodes, and wherein the MIT device has a vertical structure in which the first thin film electrode is formed on the substrate, the Ge based MIT thin film is formed on the first thin film electrode, and the second thin film electrode is formed on the Ge based MIT thin film, or has a horizontal structure in which the Ge based MIT thin film is formed on the substrate, and the first and second thin film electrodes are formed on both sides of the Ge based MIT thin film so as to face each other.

6. The MIT device of claim 4, wherein the substrate comprises one of silicon (Si), Ge, GaAs, GaSb, InP, InAs, and AlAs and has one of an n-type, a p-type, and a non-doped type, and wherein the Ge based MIT thin film comprises a low concentration of holes and has a discontinuous MIT characteristic.

7. The MIT device of claim 6, wherein the substrate comprises a buffer layer on an upper surface of the substrate, and wherein the Ge based MIT thin film is formed by using one of a sputtering method, a molecular beam epitaxy (MBE) method, an e-beam evaporation method, a thermal evaporation method, an atomic layer epitaxy (ALE) method, a pulsed laser deposition (PLD) method, a chemical vapor deposition (CVD) method, a sol-gel method, and an atomic layer deposition (ALD) method.

8. The MIT device of claim 7, wherein the buffer layer comprises at least one of an $SiO_2$ layer, an SiN layer, an $Si_3N_4$ layer, and an $Al_2O_3$ layer.

9. The MIT device of claim 4, wherein the thin film electrodes comprises at least one of aluminium (Al), copper (Cu), nickel (Ni), tungsten (W), molybdenum (Mo), chrome (Cr), zinc (Zn), magnesium (Mg), iron (Fe), cobalt (Co), tin (Sn), lead (Pb), gold (Au), silver (Ag), platinum (Pt), titanium (Ti), tantalum (Ta), TaN, TaW, WN, TiN, TiW, poly-Si, IrO, RuO, InO:Sn (InSnO), or ZnO.

10. The MIT device of claim 4, wherein a resistor is connected to one of the thin film electrodes.

11. The MIT device of claim 4, wherein the MIT device is applicable to at least one of an MIT battery, an MIT light emission device, an MIT sensor, an MIT two-terminal switching device, an MIT three-terminal switching device (transistor), an MIT memory, an MIT oscillator, and an MIT radio frequency (RF) device.

12. A method of fabricating a metal-insulator transition (MIT) device, comprising:

forming a germanium (Ge) based MIT thin film which is formed of a Ge single-element material on the substrate and in which a discontinuous MIT occurs at a predetermined transition voltage, on a substrate; and forming first and second thin film electrodes on both sides and on portions of an upper surface of the Ge based MIT thin film, on the substrate, so as to have a predetermine distance between the first and second thin film electrodes, wherein, the substrate is an undoped GaAs substrate or an undoped silicon (Si) substrate, the Ge based MIT thin film is formed on the substrate by using an MBE method, if the substrate is the undoped GaAs substrate, the undoped GaAs substrate has the same lattice structure as the Ge based MIT thin film, and if the substrate is the undoped Si substrate, the undoped Si substrate has a lattice constant that differs by approximately 7% from the lattice constant of the Ge based MIT thin film.

13. The method of claim 12, wherein the Ge based MIT thin film is formed by growing the Ge based MIT thin film at a temperature of 400~500° C. at a pressure of $10^{-10}$~$10^{-9}$ torr for ten minutes.

14. The method of claim 12, wherein the substrate comprises one of Si, Ge, GaAs, GaSb, InP, InAs, and AlAs and has one of an n-type, a p-type, and a non-doped type, wherein the method further comprises forming a buffer layer on the substrate, and wherein the Ge based MIT thin film is formed by using one of a sputtering method, a molecular beam epitaxy (MBE) method, an e-beam evaporation method, a thermal evaporation method, an atomic layer epitaxy (ALE) method, a pulsed laser deposition (PLD) method, a chemical vapor deposition (CVD) method, a sol-gel method, and an atomic layer deposition (ALD) method.

15. The method of claim 14, wherein the Ge based MIT thin film is formed by using the sputtering method and by growing the Ge based MIT thin film at a temperature of 400~500° C. at a pressure of $10^{-6}$~$10^{-5}$ torr for five minutes.

* * * * *